United States Patent [19]

Watanabe

[11] 4,003,009
[45] Jan. 11, 1977

[54] RESONANT CIRCUIT USING VARIABLE CAPACITANCE DIODE

[75] Inventor: Seiichi Watanabe, Machida, Japan

[73] Assignee: Sony Corporation, Tokyo, Japan

[22] Filed: Mar. 24, 1975

[21] Appl. No.: 561,298

[30] Foreign Application Priority Data

Mar. 25, 1974 Japan .............................. 49-33224

[52] U.S. Cl. .................................... 334/15; 357/14
[51] Int. Cl.² ...................... H03H 5/12; H03J 3/06; H03J 5/04
[58] Field of Search ...................... 334/15; 357/14

[56] References Cited

UNITED STATES PATENTS

| | | | |
|---|---|---|---|
| 3,409,845 | 11/1968 | Ogi et al. ........................ | 334/15 X |
| 3,535,600 | 10/1968 | Engeler ........................... | 357/14 |
| 3,579,278 | 5/1971 | Heer ................................. | 357/14 |
| 3,808,472 | 4/1974 | Engeler ........................... | 334/15 |
| 3,813,615 | 5/1974 | Okazaki ........................... | 334/15 |
| 3,825,858 | 7/1974 | Amemiya et al. ............... | 334/15 |

OTHER PUBLICATIONS

"High Capacitance PN Junction Capacitors" by V. Y. Doo, IBM Technical Disclosure, vol. 9, No. 7, 12/66.

Primary Examiner—Saxfield Chatmon, Jr.
Attorney, Agent, or Firm—Hill, Gross, Simpson, Van Santen, Steadman, Chiara & Simpson

[57] ABSTRACT

A resonance circuit having an inductor, a capacitor and a semiconductor with a junction, and means for applying a signal to the semiconductor junction. The semiconductor junction satisfies the equation:

$$C' \frac{d^2C}{dV^2} = \frac{4}{3} \left( \frac{dC}{dV} \right)^2$$

where C represents the capacitance of the semiconductor junction when a voltage V is applied thereto and the junction of the semiconductor is reverse biased, C' is a constant, and the inductor and capacitor are connected in series.

8 Claims, 27 Drawing Figures

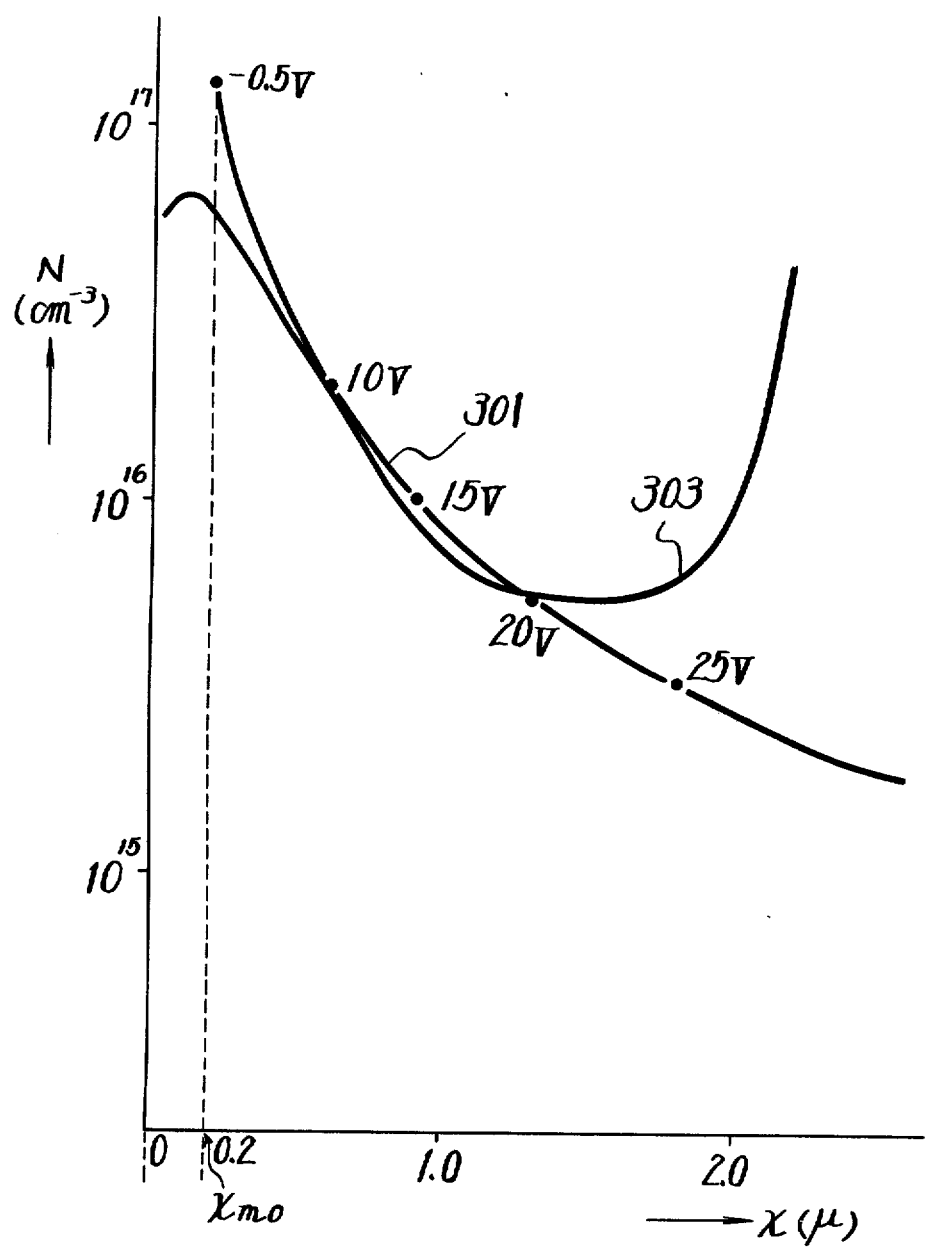

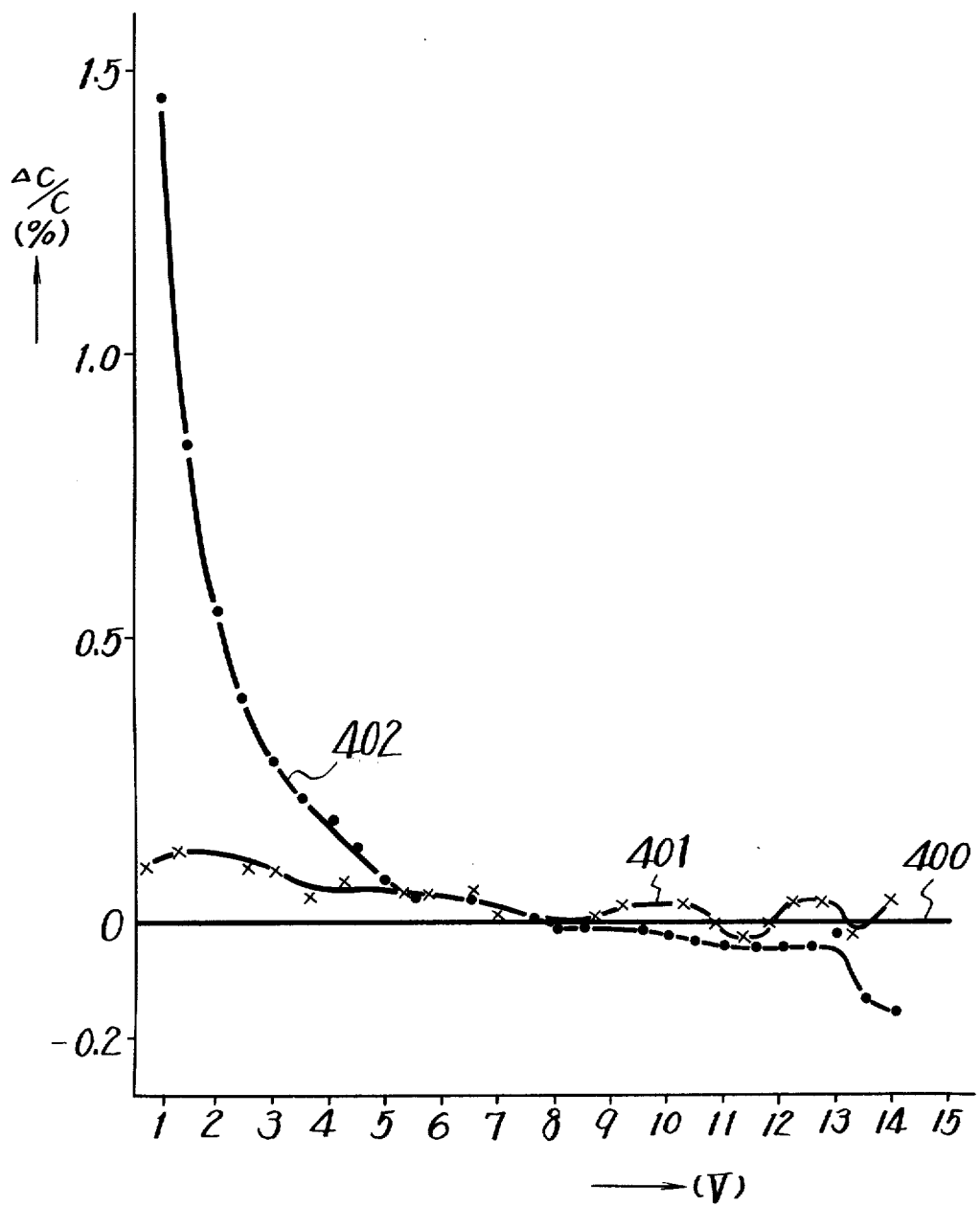

Fig. 10    Fig. 11    Fig. 12
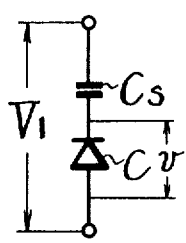
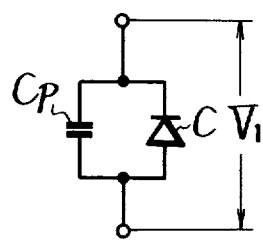
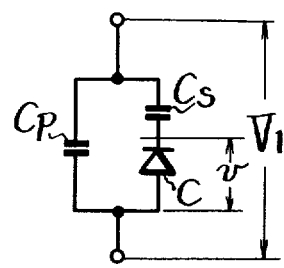
Fig. 13    Fig. 14
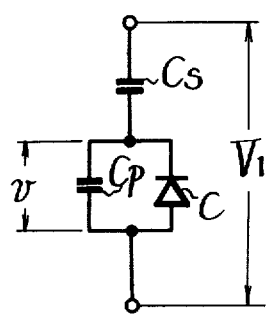
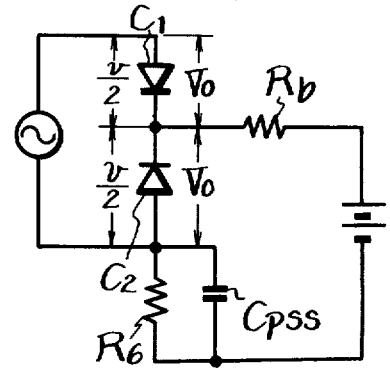
Fig. 15
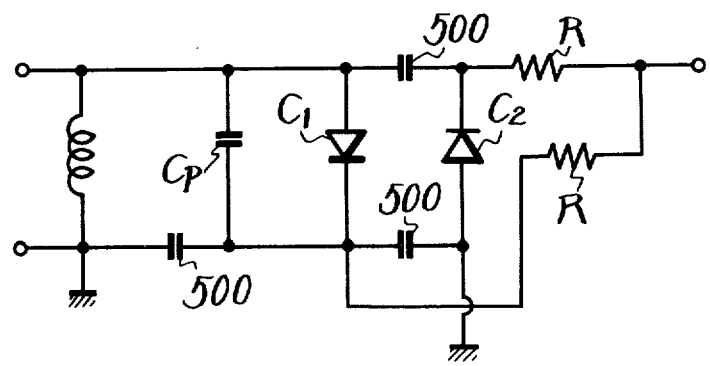

RESONANT CIRCUIT USING VARIABLE CAPACITANCE DIODE

BACKGROUND OF THE INVENTION

1. Field of the Invention

The present invention relates generally to a resonance circuit using a variable capacitance semiconductor element, and is directed more particularly to a resonant circuit using a variable capacitance diode.

2. Description of the Prior Art

Recently, a so-called electronic tuner (which will be hereinafter referred to as an ET tuner) using a variable capacitance semiconductor element (which will be hereinafter referred to as a varicap) has been proposed. However, the non-linearity of the varicap may cause a tuning frequency deviation (which may be a cause of tracking error) due to the large amplitude operation of the local oscillator in a television tuner. Also, mutual modulcation, cross modulation and so on in an FM tuner may result, and for these reasons ET tuners are not used widely at present.

SUMMARY OF THE INVENTION

According to the present invention, there is proposed a resonant circuit which comprises an inductive means, and a capacitive means having a semiconductor junction element which satisfies the equation:

$$C' \cdot \frac{d^2C}{dV^2} = \frac{4}{3} \left(\frac{dC}{dV}\right)^2,$$

where C is the capacitance of the element when a voltage V is applied and the junction of the element is reverse biased. C' is a constant and the inductive and capacitive means are connected in series, and means are provided for applying a signal to the element.

Accordingly, it is an object of the invention to provide a resonant circuit free from the defects encountered in the prior art.

It is another object of the invention to provide a resonant circuit using a capacitive element such as a varicap.

It is a further object of the invention to provide a resonant circuit using a novel capacitive element such as a varicap which solves the non-linearity problem of prior art varicaps.

Other objects, features and advantages of the invention will be well understood by the following description taken on conjunction with the accompanying drawings in which like reference numerals and symbols used through the description indicate like elements.

BRIEF DESCRIPTION OF THE DRAWINGS

FIG. 5 is a graph showing impurity profiles;

FIG. 7 is a graph showing the distortion ratio of varicaps;

FIGS. 10 to 13, inclusive, are circuit diagrams showing capacitance arrangements, which are used in the resonant circuit of the invention;

FIG. 14 is a circuit diagram showing an example of a series resonant circuit of the invention; and FIG. 15 is a circuit diagram illustrating an arrangement for the invention.

DESCRIPTION OF THE PREFERRED EMBODIMENTS

The present invention will be described with reference to the drawings.

Figure 1:
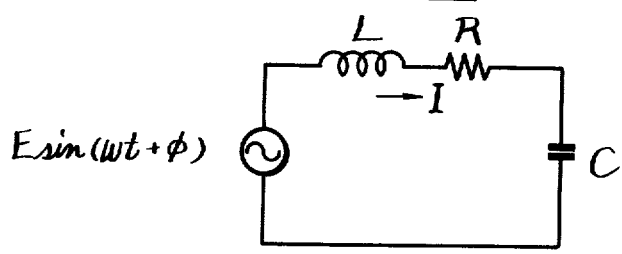
FIG. 1 is a circuit diagram for explaining the theory of the invention.
Figure 2:
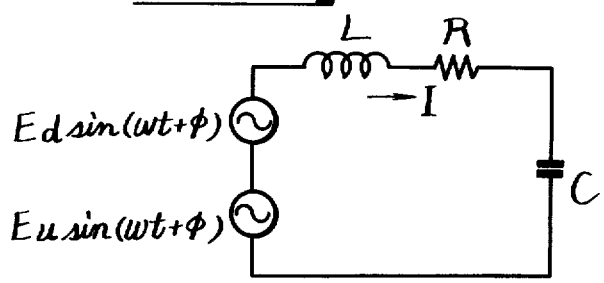
FIG. 2 is a circuit diagram for explaining cross modulation.

FIG. 1 illustrates a fundamental circuit of the invention comprising a series resonant circuit which includes an inductance L, a resistance R and a capacitance C. It will be considered that the capacitance C depends upon the applied voltage or is a nonlinear capacitance. The voltage across the capacitance C is V and its changing value or signal component $\delta V$ is sufficiently small as compared with a DC bias $V_o$ applied to the capacitance C, the nonlinear capacitance can be expressed in the form of a Taylor's series as follows:

$$C(V_o + \delta V) = C(V_o) + \frac{dC}{dV} \delta V + \frac{1}{2} \frac{d^2C}{dV^2} (\delta V)^2 + \quad (1)$$

If the first and second terms of the above Taylor's series (1) are taken as an approximation, the following expression (2) is obtained:

$$C(V_o + \delta V) \simeq \left(1 + \frac{\beta}{\alpha} \delta V + \frac{\gamma}{\alpha} (\delta v)^2\right) \quad (2)$$

where, $$\alpha = C(V_o) \equiv C_o, \beta = \left(\frac{dC}{dV}\right)_{C=\alpha} \text{ and } \gamma = \frac{1}{2} \left(\frac{d^2C}{dV^2}\right)_{C=\alpha} \quad (3)$$

In this invention, it is assumed that the influence of nonlinearity is small and it is assumed that the following conditions exist:

$$\frac{\beta}{\alpha} \delta V << 1, \frac{\gamma}{\alpha} (\delta V)^2 << 1 \quad (4)$$

If the circuit shown in FIG. 1 is energized with a signal E sin (t + $\phi$) and if the current flowing through the circuit is I, the following differential equation (5) is obtained:

$$L \frac{dI}{dt} + RI + \int \frac{I}{C} dt = E \sin(\omega t + \phi) \quad (5)$$

Since the capacitance C depends upon the voltage, equation (5) is a non-linear differential equation.

In the invention, an equation (29) which gives an approximate solution will be described later. If equation (29) is applied to the capacitance C in order to make equation (5) linear, and the linear equation thus obtained is compared with the linear equation which is obtained by considering the capacitance C in the original equation (5) constant, then a distortion component will have been considered, and the phenomenon expressed by the non-linear equation (5) is approximated as linear. Thus, the varicap which may be the total capacitance C on which may form a part of the capacitance C is designed with specific parameters so as to substantially eliminate the above mentioned undesirable phenomena existing in the non-linear circuit including the capacitance, which depends upon the voltage, in the series resonant circuit.

First, the non-linear differential equation (5) is considered.

The current I, which flows through the circuit shown in FIG. 1 when a signal $E \sin(\omega t + \phi)$ is applied, is expressed as follows:

$$I = C \frac{dV}{dt} \qquad (6)$$

The voltage V appearing across the capacitance C can be expressed as follows:

$$V = \int \frac{I}{C} dt \qquad (7)$$

It is assumed in such oscillating condition that the voltage V is expressed by the following equation.

$$V = E_1 \sin \omega t + V_1 \cos \omega t + e_2 \sin 2\omega t + v_2 \cos 2\omega t + \qquad (8)$$

That is, all of the combinations of the fundamental wave component are the same as the input signal and wave components with frequencies $n/m$ times $\omega$ considered. In the combinations, waves which will be effective oscillating ones are present and 2nd order higher harmonics are considered in equation (8). Further, if for the sake of brevity, $\sin \omega t$, $\cos \omega t$, $\sin 2\omega t$ and $\cos 2\omega t$ are expressed hereinafter as $s(1)$, $c(1)$, $s(2)$ and $c(2)$, respectively, the following equation (9) is obtained:

$$V = E_1 s(1) + e_2 s(2) + v_2 c(2) \qquad (9)$$

In this case, since the exciting signal $E \sin(\omega t + \phi)$ has a phase factor, in the circuit of FIG. 1, the term $c(1)$ is unnecessary.

The equations (6) and (7) are obtained by applying a voltage V expressed by equation (12) to be described later.

First, differentiate V with respect to time $t$ to obtain:

$$\frac{dV}{dt} = \omega [E_1 c(1) + 2 e_2 c(2) - 2 v_2 s(2)] \qquad (10)$$

If equation (10) is substituted into equation (2) as the factor $\delta V$, the following equation (11) will be obtained:

$$C = \alpha \left[ 1 + \frac{\gamma}{2\alpha}(E_1^2 + e_2^2 + v_2^2) + \frac{\gamma}{\alpha} E_1 e_2 c(1) \right.$$

$$+ \left( \frac{\beta}{\alpha} E_1 - \frac{\gamma}{\alpha} E_1 v_2 \right) s(1) + \left( \frac{\beta}{\alpha} v_2 - \frac{\gamma}{2\alpha} E_1^2 \right) c(2)$$

$$+ \frac{\gamma}{2\alpha} E_1 e_2 c(3)$$

$$\left. + \frac{\gamma}{2\alpha} \left( v_2^2 + 2 v_2 e_2 \right) s(4) - \frac{\gamma e_2^2}{2\alpha} c(4) \right] \qquad (11)$$

The current I can be obtained by substitution of equations (10) and (11) in equation (6). In this case, if the non-linearity is small, the following conditions can be experimentally expected, $$e_2 \ll E_1, \; v_2 \ll E_1 \qquad (12)$$

Therefore, the terms following the term of $3\omega$ become sufficiently small that they can be neglected. Thus, the current I becomes:

$$I = \omega \alpha \left[ \left( 1 + \frac{\gamma E_1^2}{4\alpha} - \frac{\beta v_2}{2\alpha} + \left( \frac{\gamma e_2^2}{\alpha} + \frac{\gamma v_2^2}{\alpha} \right) \right) E_1 c(1) \right.$$

$$- \left( \frac{\beta e_2}{2\alpha} - \frac{\gamma v_2 e_2}{2\alpha} \right) E_1 s(1) + \left( 2 + \frac{5\gamma E_1}{4\alpha} + \frac{\gamma}{2\alpha} \left( e_2^2 - \frac{v_2^2}{e_2} \right) \right) e_2 c(2)$$

$$\left. - \left( 2 - \frac{\beta E_1^2}{2\alpha v_2} + \frac{5nE_1^2}{4\alpha} + \frac{\gamma}{2\alpha}(2v_2^2 + e_2^2 - v_2 e_2) \right) v_2 s(2) \right] \qquad (13)$$

Based upon equation (12), if the terms of equation (13) which include the factors $e_2^2$ and $v_2^2$ are neglected due to the assumption that they are small as compared with $E_1^2$, the following equation (14) is obtained:

$$I = \omega\alpha \left[ \left(1 + \frac{\gamma E_1^2}{4\alpha} - \frac{\beta v_2}{2\alpha}\right) E_1 c(1) - \left(\frac{\beta e_2}{2\alpha} - \frac{\gamma v_2 e_2}{2\alpha}\right) E_1 s(1) \right.$$

$$\left. + \left(2 + \frac{5\gamma E_1}{4\alpha}\right) e_2 c(2) - \left(2 - \frac{\beta E_1^2}{2\alpha v_2} + \frac{5\gamma E_1^2}{4\alpha}\right) s(2) \right] \quad (14)$$

The first term $dI/dt$ in the differential equation (5) will now be obtained.

$$\frac{dI}{dt} = -\omega^2\alpha \left[ \left(1 + \frac{\gamma E_1^2}{4\alpha} - \frac{\beta v_2^2}{2\alpha}\right) E_1 s(1) \right.$$

$$+ \left(\frac{\beta e_2}{2\alpha} - \frac{\gamma v_2 E_1^2}{2\alpha}\right) E_1 c(1) + 2 \left. \right) 2 + \frac{5\gamma E_1^2}{4\alpha}\right) e_2 s(2)$$

$$\left. + 2 \left(2 - \frac{\beta E_1^2}{2\alpha v_2} + \frac{5\gamma E_1^2}{4\alpha}\right) c(2) \right] \quad (15)$$

Next, if equation (9) is substituted into equation (7), and the resulting equation and equations (14) and (15) are substituted into equation (5) and factors with respective to the respective frequencies are fixed. Further, the following equation (16) is assumed.

$$\omega_o^2 = \frac{1}{LC_o} \quad (16)$$

Then $\omega$, is considered to be in the vicinity of or at the resonant frequency $\omega_o$.

Further, the following expressions (17) to (20) are considered:

$$\frac{1}{\omega_o \alpha R} \equiv Q \gg 1 \quad (17)$$

$$\left(\frac{\omega}{\omega_o} - 1\right) 2Q \equiv \Delta \quad (18)$$

$$e_2 - \frac{2v_2}{Q} - 2\left(\frac{\omega_o}{\omega}\right)^2 \left(2v_2 + \frac{5\gamma E_1^2}{4\alpha} e_2\right) = 0 \quad (19)$$

$$v_2 + \frac{2e_2}{Q} - 2\left(\frac{\omega_o}{\omega}\right)^2 \left(2v_2 + \frac{5\gamma E_1^2}{4\alpha} v_2 - \frac{\beta E_1^2}{2\alpha}\right) = 0 \quad (20)$$

From expression (18), the following expression (21) is obtained:

$$\left(\frac{\omega}{\omega_o}\right)^2 \approx 1 + \frac{\Delta}{Q} \quad (21)$$

Therefore the equations (19) and (21) can be expressed as follows:

$$e_2 \left(3 + \frac{5\gamma E_1^2}{2\alpha} + \frac{\Delta}{Q}\right) + \frac{2}{Q} v_2 = 0 \quad (22)$$

$$v_2 \left(3 + \frac{5\gamma E_1^2}{2\alpha} + \frac{\Delta}{Q}\right) - \frac{2}{Q} e_2 = -\frac{\beta E_1^2}{\alpha}\left(1 + \frac{\Delta}{Q}\right) \quad (23)$$

From the equations (22) and (23), $e_2$ and $v_2$ can be obtained as follows with the first small terms neglected.

$$e_2 \approx \frac{\beta E_1^2}{3Q\alpha_2} \quad (24)$$

$$v_2 \approx \frac{\beta E_1}{3\alpha} \quad (25)$$

In this case, $e_2 = 1/Q\, v_2$ and hence $e_2$ can be neglected from a practical matter. Therefore, $e_2 = 0$.

The factors of $\omega$ will now be considered. In this case, if the values obtained by the expressions (24) and (25) are substituted into equation (5) and if its second terms and higher ones are neglected, the following equation (26) is obtained:

$$\left\{1 - \left(\frac{\omega}{\omega_o}\right)^2 \left(1 + \frac{\gamma E_1^2}{4\alpha} - \frac{\beta v_2}{2\alpha}\right)\right\} E_1 s(1) + \frac{1}{Q} E_1 c(1)$$

$$= E \sin(\omega t + \phi) \quad (26)$$

This equation (26) represents the operation of the fundamental wave component.

If the differential equation (5) is similarly calculated with the assumption that the capacitance does not depend upon the amplitude, the following equation (27) is obtained.

$$\left\{1-\left(\frac{\omega}{\omega_o}\right)^2\right\}E_1 s(1) + \frac{1}{Q} E_1 c(1) = E \sin(\omega t + \phi) \quad (27)$$

As may be apparent from the insertion of $$v_2 \approx \frac{\beta E_1^2}{3\alpha}$$

into equation (26) and by comparing the results with equation (27), the non-linear differential equation (5) can be taken as a linear equation in the case where a capacitance variation $\Delta C$ such as expressed as follows exists for a linear capacitance.

$$\frac{\Delta C}{C} = \left(\frac{\gamma}{4\alpha} - \frac{\beta^2}{6\alpha^2}\right) E_1^2 \quad (28)$$

Accordingly, if for the capacitance $C$ the following capacitance $C$ is used, a linear differential equation effective for the nonlinear differential equation can be approximately obtained.

$$C = C_o\left(1 + \frac{P^*}{4} E_1^2\right) \quad (29)$$

where $$P^* = \frac{\gamma}{\alpha} - \frac{2\beta^2}{3\alpha^2} \quad (30)$$

In other words, from equations (28) or (29) if $E_1$ is small, non-linearity has almost no influence. However, if the following equation (31) or (32) is established, influence of non-linearity on the series resonant circuit shown in FIG. 1 can be neglected.

$$P^* = \frac{\gamma}{\alpha} - \frac{2\beta^2}{3\alpha^2} = 0 \quad (31)$$

or $$C \cdot \frac{d^2C}{dV^2} = \frac{4}{3}\left(\frac{dC}{dV}\right)^2 \quad (32)$$

(where $C' = C$)

The above description has given particular consideration to the tracking error, but the problems of cross modulation will now be considered.

Cross modulation is due to non-linear capacitance in a series resonant circuit consisting of an inductance L, a resistance R and a capacitance C and wherein a desired signal $\omega d$ and a jamming signal $\omega u$ are applied thereto. In this case, a consideration to that given for the tracking error will be given. In this case, as the frequency components of the voltage applied across the capacitance C, it is sufficent if the terms $2\omega d$, $2\omega u$, $\omega d + \omega u$ and $\omega d - \omega u$ in addition to $\omega d$ and $\omega u$ are taken into account. Further, hereinafter $\sin \omega dt$ is expressed as $s(1)$; $\cos \omega dt$ as $c(1)$; $\cos 2\omega dt$ as $c(2)$; $\sin \omega ut$ as $s(I)$; $\cos \omega ut$ as $c(I)$; $\cos 2\omega ut$ as $c(II)$; $\cos(\omega d - \omega u)t$ as $c(1-I)$; and $\cos(\omega d + \omega u)t$ as $c(1+I)$, respectively.

Further, the applied voltage V is defined as follows:
$V = E_1 \sin \omega dt + v_2 \cos 2\omega dt + W_1 \sin \omega ut + \omega_2 \cos 2\omega ut + e_a \cos(\omega d - \omega u)t + e_s \cos(\omega d + \omega u)t$
$= E_1 s(1) + v_2 c(2) + W_1 s(I) = w_2 c(II) + e_a c(1-I) + e_s c(1+I)$ (100)

$$\frac{dV}{dt} = \omega d\{E_1 c(1) - 2v_2 s(2)\} + \omega u\{E_1 c(I) - 2\omega_2 s(II)\}$$
$$- (\omega d - \omega u)e_0 s(1-I) - (\omega d + \omega u)e_s s(1+I) \quad (101)$$

$$C \approx \alpha \left[1 + \frac{\beta}{\alpha}\{E_1 s(1) + W_1 s(I) + v_2 c(2) + \omega_2 c(II)\right.$$
$$+ e_0 c(1-I) + e_s c(1+I)\} + \frac{\gamma}{2\alpha}\{E_1^2 + W_1^2\}$$
$$+ 2E_1W_1\{c(1-I) - c(1+I)\} + 2E_1v_2\{-s(1) + s(3)\}$$
$$+ 2W_1w_2\{-s(I) + s(III)\} + E_1^2 c(2) + W_1^2 cc(II)$$
$$+ 2E_1w_2\{s(1+II) - s(II-1)\} + 2E_1e_0\{s(2-I) + s(I) + s(I)\}$$
$$+ 2W_1v_2\{s(2+I) - s(2-I)\} + 2W_1e_0\{s(1) + s(II-1)\}$$
$$+ 2E_1e_s\{s(2+I) - s(I)\} + 2W_1e_s\{s(1+II) - s(1)\} \quad (102)$$

where factors $v_2^2$, $w_2^2$, $e_2^2$ and $e_o^2$ and their mutual products are neglected.

$$I = C\frac{dV}{dt}$$

$$= \omega d\alpha \left[\left(E_1 + \frac{\gamma E_1}{4\alpha}(E_1^2 + 2W_1^2) - \frac{\beta E_1 v_2}{2\alpha} - \frac{\beta W_1 e_s}{2\alpha} + \frac{\beta W_1 e_0}{2\alpha}\right) c(1)\right.$$

$$+ \left(-2v_2 + \frac{\beta E_1}{2\alpha}\right) s(2) \right] + \omega u\alpha \left[\left\{W_1\left(1 + \frac{\gamma W_1}{4\alpha} + \frac{\gamma E_1}{2\alpha}\right)\right.\right.$$

$$-\frac{\beta}{2\alpha} W_1 w_2 - \frac{\beta E_1 e_2}{2\alpha} + \frac{\beta E_1 e_0}{2\alpha} \Bigg\} c(1) + \Bigg\{ -2w_2 + \frac{\beta W_1{}^2}{2} \Bigg\} s(II) \Bigg]$$

$$+ (\omega d + \omega u) \Bigg\{ -e_2 + \frac{\beta E_1 W_1}{2\alpha} \Bigg\} s(1 + I) + (\omega d - \omega u)$$

$$\Bigg\{ -e_0 - \frac{\beta}{2\alpha} W_1 E_1 \Bigg\} s(1 - I) \tag{103}$$

By substituting equation (103) into equation (2) for the factor $\delta V$, equations for the respective frequency components are obtained. In this case, $\omega d$ and $\omega u$ are assumed to be sufficiently close to $\omega_o$ and $\Delta d$ and $\Delta u$ are assumed as follows:

$$\Delta d \left( \frac{\omega d}{\omega_o} - 1 \right) 2Q \tag{104}$$

$$\Delta u \left( \frac{\omega u}{\omega_o} - 1 \right) 2Q \tag{105}$$

$$\left.\begin{array}{c} \frac{\Delta d}{Q} << 1 \\ \frac{\Delta u}{Q} << 1 \end{array}\right\} \tag{106}$$

$e_2$ is obtained from the component of $(\omega d + \omega u)$ where $Q >> 1$ is assumed and the first small term is neglected.

$$e_2 \approx \frac{2\beta E_1 W_1}{3\alpha} \tag{107}$$

$e_0$ is obtained from the component $(\omega d - \omega u)$.

$$e_o \approx \frac{3E_1 W_1}{8Q^2 \alpha} \approx 0 \tag{108}$$

From the component $2\omega d$, $v_2$ is obtained as follows:

$$v_2 \approx \frac{\beta E_1 2}{3\alpha} \tag{109}$$

From the component $2 u$, $w_2$ is obtained as follows:

$$w_2 \approx \frac{\beta W_1{}^2 \omega}{3\alpha} \tag{110}$$

It will be apparent that equations (109) and (110) are substantially the same in form as equation (25).

From the components $\omega d$ and $\omega u$, the following equations are derived.

$$E_1 \Bigg[ 1 - \left( \frac{\omega d}{\omega_o} \right)^2 \Bigg\{ 1 + \frac{1}{4} \left( \frac{\gamma}{\alpha} - \frac{2\beta^2}{3\alpha^2} \right) E_1{}^2 + \frac{1}{2} \left( \frac{\gamma}{\alpha} - \frac{2\beta^2}{3\alpha^2} \right) W_1{}^2 \Bigg\} \Bigg] s(1) + \frac{v_1}{Q} c(1) = Ed \sin(\omega t + \phi) \tag{111}$$

$$W_1 \Bigg[ 1 - \left( \frac{\omega w}{\omega_o} \right)^2 \Bigg\{ 1 + \frac{1}{4} \left( \frac{\gamma}{\alpha} - \frac{2\beta^2}{3\alpha^2} \right) W_1{}^2 + \frac{1}{2} \left( \frac{\gamma}{\alpha} \frac{2\beta^2}{3\alpha^2} \right) E_1{}^2 \Bigg\} \Bigg] s(I) + \frac{W_1}{Q} c(I) = Eu \sin(\omega t + \phi) \tag{112}$$

From equations (111) and (112) and equation (29), the following equations (113) and (114) are obtained.

$$E_1^2 \left[ 1 + \frac{Q^2 W_1^2}{1+\Delta d^2} \left( \frac{P^*}{4} W_1^2 + 2 \left( \frac{\Delta d}{Q} + \frac{P^*}{4} E_1^2 \right) \right) \right.$$

$$\left. + \frac{Q^2}{1+\Delta d^2} \left( \frac{P^{*2} E_1^4}{16} + \frac{\Delta d}{2Q} P^* E_1^2 \right) \right] = \frac{(QEd)^2}{1+\Delta d^2} \quad (113)$$

$$W_1^2 \left[ 1 + \frac{Q^2}{1+\Delta u^2} \left( \frac{P^*}{4} E_1^4 + \frac{2\Delta u}{Q} P^* E_1^2 \right) \right.$$

$$\left. + \frac{Q^2 P^* W_1^2}{1+\Delta u^2} \left( \frac{P^* W_1^2}{16} + \frac{\Delta u}{2Q} + \frac{P^* E_1^2}{2} \right) \right] = \frac{(QEu)^2}{1+\Delta u^2} \quad (114)$$

The component $I_d$ with $\omega d$ in the current I is expressed as follows:

$$I_d = \omega d \alpha\, E_1 \left( 1 + \frac{P^*}{4} E_1^2 + \frac{P^*}{2} W_1^2 \right) \cos \omega d t \quad (115)$$

From equation (114), a minute variation (factor) $\epsilon u$ exists in Eu, a variation factor $\epsilon_w$ of $W_1$ when $Eu(1 + \epsilon u)$ is obtained, a variation factor $\epsilon_v$ of $E_1$ is obtained from the equation (113), and a variation factor $\epsilon_d$ of $I_d$ is obtained from the equation (115). The cross modulation K is given by the ratio of $\epsilon_d$ and $\epsilon_u$. In this case, $\epsilon_w$, $\epsilon_u \ll 1$ and $\epsilon_d$, $\epsilon_v \ll \epsilon_w$, $\epsilon_u$ can be assumed.

From the equation (114), the following equation (116) is derived:

$$1 + 2\epsilon_v + \epsilon_w \frac{\frac{Q^2 P^* W_1^2}{1+\Delta u^2}\left( \frac{P^* W_1^2}{4} + P^* E_1^2 + \frac{\Delta u}{Q} \right)}{\frac{Q^2 E_u^2}{W_1^2(1+\Delta u^2)}} = 1 + 2\epsilon_u \quad (116)$$

From the equation (116), $\epsilon_w$ is expressed as follows:

$$\epsilon_w = \frac{\epsilon u}{1 + \frac{W_1^2 P^* W_1^2}{2E_u^2}\left( \frac{\Delta u}{Q} + \frac{P^* W_1^2}{4} + P^* E_1^2 \right)} \quad (117)$$

From the equation (113), the following equation (118) is derived.

$$1 + 2\epsilon_v + \frac{\frac{4Q^2 P^* W_1^2}{1+d^2}\left( \frac{\Delta d}{Q} + \frac{P^* W_1^2}{4} + \frac{P^* E^2}{4} \right)}{\frac{(Qed)^2}{E_1^2(1+\Delta d^2)}} \epsilon_w = 1 \quad (118)$$

Accordingly, $\epsilon_v$ is obtained as follows:

$$\epsilon_v = -\frac{2E_1^2 P W_1^2}{Ed^2}\left( \frac{\Delta d}{Q} + \frac{PW_1^2}{4} + \frac{PE_1^2}{4} \right)\epsilon_w \quad (119)$$

From the equation (115), $\epsilon_d$ is expressed as follows:

$$\epsilon_d = \epsilon_v + PW_1^2 \epsilon_w \quad (120)$$

From the equations (117), (119) and (120), K is expressed as follows:

$$K = \frac{\epsilon_d}{\epsilon_u} = \frac{P^* W_1^2 - \frac{2E_1^2}{E_d} P^* W_1^2 \left( \frac{\Delta d}{Q} + \frac{P^* W_1^2}{4} + \frac{P^* E_1^2}{4} \right)}{1 + \frac{W_1^2}{2E_u^2}\left( \frac{\Delta u}{Q} + \frac{P^* E_1^2}{4} + P^* E_1^2 \right) P^* W_1^2} \quad (121)$$

Further, if consideration is given to the ratio K in the case where $$P^* E_1^2, P^* W_1^2 \ll \frac{\Delta d}{Q}, \frac{\Delta u}{Q},$$

the following equations (122) and (123) are obtained approximately:

$$\frac{E_t^2}{E_d^2} = \frac{Q^2}{1+\Delta d^2} \quad (122)$$

$$\frac{W_t^2}{E_u^2} = \frac{Q^2}{1+\Delta u^2} \quad (123)$$

Further, it is assumed that $$\frac{Q^2}{1+\Delta u^2} \cdot P^*W_t^2 \ll 1$$

which means that the amplitude of the jamming wave is relatively small. In general, if the cross modulation is taken into account, the amplitude is small as compared to the case where the tracking error is taken into account. Therefore, the above assumption if valid.

Accordingly, the following equation (124) is obtained:

$$K \approx \frac{Q^2 E_u^2 P^*}{1+\Delta u^2}\left(1 - \frac{2\Delta dQ}{1+\Delta d^2}\right) \approx -\frac{2\Delta dQ^3 E_u^2 P^*}{(1+\Delta u^2)(1+\Delta d^2)} \quad (124)$$

If $N_u = (QE_u)^2 P^*$, K is expressed as follows:

$$K \approx -\frac{2\Delta dN_u}{(1+\Delta u^2)(1+\Delta d^2)} \quad (125)$$

In order to reduce the cross modulation ratio K, P* is reduced until it approaches zero.

According to the present invention, based upon the above considerations, P* = O is obtained or the relationship between C and V which are solutions of the differential equation (32) namely $$C\frac{d^2C}{dV_o^2} = \frac{4}{3}\left(\frac{dc}{dV_o}\right)^2$$

is obtained, and then a semiconductor varicap, which has the C - V characteristics which satisfies the above relationship is formed.

In other words, a semiconductor varicap is constructed having the impurity concentration showing the above C - V characteristics.

First, C is assumed as follows:

$$C = C_D(V_o + V_D)^n \quad (200)$$

where $C_D$ and $V_D$ represent integral constants.

If the equation (200) is substituted into the equation (32), the following equation (201) is derived.

$$n(n-1) = \frac{4}{3}n^2 \therefore n = -3 \quad (201)$$

Therefore, the equation (200) can be rewritten as follows:

$$C = C_D(V_o + V_D)^{-3} \quad (202)$$

If desired voltage range and capacitance variation are given in the equation (202), the constants $C_D$ and $V_D$ are obtained, respectively, and a semiconductor varicap of P* = 0 is formed. For example, if it is assumed that when $V_o = 2$ volts, $C = 15_pF$ and that when $V_o = 25$ volts, $C = 2.25_pF$, $C_D$ and $V_D$ become as follows:

$C_D = 2.66 \times 10^{15}\ (_pF^{V3})$
$V_D = 24.1$ (volts)

Figure 3:
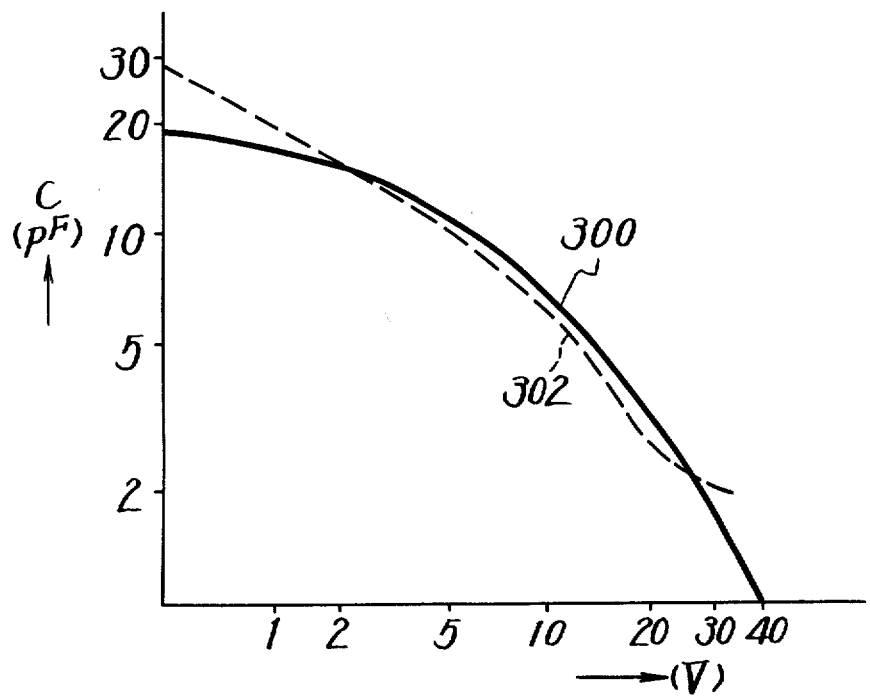
FIG. 3 is a graph showing the C-V characteristics.

The C - V characteristic of the varicap in this case is shown by curve 300 in the graph of FIG. 3.

Figure 4:
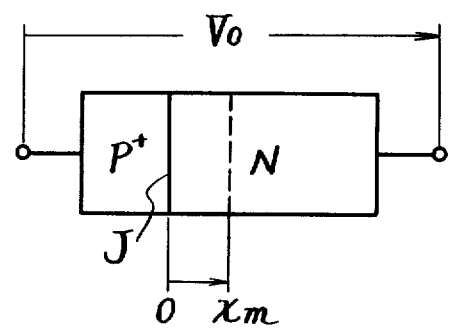
FIG. 4 is an enlarged cross-sectional diagram showing an example of a varicap.

Consideration will now be given as to how to obtain an impurity concentration to produce a varicap with the above C - V characteristic. Now, it is assumed that, in a semiconductor varicap having a PN junction J, the position of the PN junction J is taken as O and the expansion of its depletion layer from the position O is taken as $x_m$, as shown in FIG. 4. It is also assumed that the impurity concentration distribution in the expansion direction of the depletion layer is N(x). An applied voltage $V_o$ to the varicap is expressed as follows:

$$V_o = \frac{q}{\epsilon}\int_0^{x_m}\int_x^{x_m} N(x)\, dx\, dx' - \phi_D \quad (203)$$

where $\phi_D$ represents an expansion potential difference, $\epsilon$ the dielectric constant of the semiconductor and $q$ an electrical charge.

$V_o$ will be obtained from the equation (202).

If the area of the junction J is taken as S, C is expressed as follows:

$$C = \frac{S}{x_m} \quad (204)$$

Therefore, the following equation (205) is obtained.

$$V_o + V_D = \left(\frac{C_D}{\epsilon S}\right)^{1/3} x_m^{1/3} \quad (205)$$

A sufficient solution will exist if the equations (203) and (205) have the same form.

The following equation (206) is assumed and substituted into equation (203).

$$N(x) = Ax^{-n} \quad (206)$$

$$N(x) = Ax^{-n} \quad (206)$$

$$V_o = \frac{-q}{\epsilon} \cdot \frac{Ax^{-n+2}}{n-2} + K - \phi_D \quad (207)$$

From the equations (205) and (207), A is expressed as follows:

$$A = \frac{\epsilon}{3q} \left(\frac{C_D}{\epsilon S}\right)^{1/3} \quad (208)$$

Therefore, $N(x)$ is expressed as follows:

$$N(x) = \frac{\epsilon}{3q} \left(\frac{C_D}{\epsilon S}\right)^{1/3} x_m^{-5/3} \quad (209)$$

If, in the above example, the area S is taken as $3.9 \times 10^{-4} \text{cm}^2$ ($S = 3.9 \times 10^{-4} \text{cm}^2$), the impurity concentration distribution $N(x)$ is expressed as follows:

$$N(x) = 4.16 \times 10^9 \, x_m^{-5/3}$$

This impurity concentration distribution is shown by a curve 301 in the graph of FIG. 5.

The ideal impurity concentration distribution curve 301 has its peak value at a depth of about 0.2 μ (microns) from the position of the junction ($x = 0$) and the expansion width of the depletion $x_{mo}$ corresponding to $V = 0$ exists at about $0.2\mu$, the same as the peak value. This means that when the external voltage is zero, the depletion layer must be expanded to that position due to the diffusion potential difference. The C - V characteristic and impurity concentration distribution of an example of varicaps now on market are shown by curve 302 in FIG. 3 and by curve 303 in FIG. 5.

As is apparent from a comparison of the curves 301 and 303, the ideal curve 301 has the peak at the depth of $0.2\mu$ and the peak value of its impurity concentration is about $1.2 \times 10^{17}$ atom/cm$^3$, while that of the prior art is about $\sim 6 \times 10^{16}$ atom/cm$^3$. If the C - V characteristic curves 300 and 302 are compared, there is a great difference between them at low voltages. This illustrates the fact that tuners which use the prior art semiconductor varicaps have large tracking errors particularly at low voltages.

Therefore, a semiconductor varicap, which is used in the resonant circuit of this invention, has a semiconductor layer with a sufficiently low impurity concentration formed on the surface of a semiconductor substrate wherein a junction is formed, and the depletion layer of the junction is expanded to a position which results in the peak value of a predetermined impurity concentration when V =O.

Figure 6A:
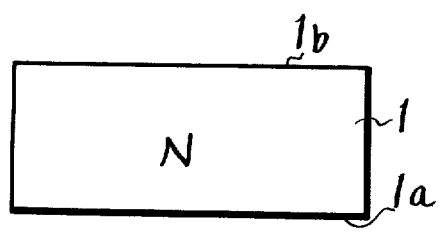
FIGS. 6A to 6E, inclusive, are diagrams showing the steps for making varicaps which could be used in the invention.

An example of the method for making the above varicap of the invention will now be described with reference to FIGS. 6A to 6E. As shown in FIG. 6A, a semiconductor substrate of one conductivity type, for example, a single crystalline silicon substrate 1 with an N-type impurity concentration of $\sim 10^{19}$ atom/cm$^3$ is prepared.

Figure 6B:
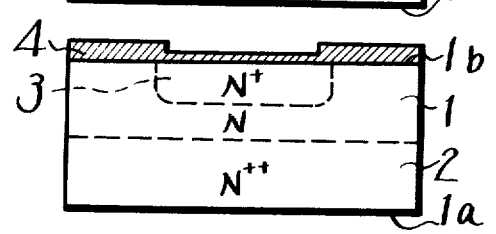

As shown in FIG. 6B, a semiconductor layer 2 of high impurity concentration with the same conductivity type as that of the substrate 1, which semiconductor layer 2 serves to support in ohmic contact an electrode (described later), is formed on one surface 1a of the substrate 1, for example, by diffusion, and an impurity of the same conductivity type as that of the substrate 1 is selectively diffused therein from its other surface 1b to form a diffusion region 3. In this case, the diffusion region 3 is so formed that its impurity concentration distribution in the direction from the surface 1b of the substrate 1 to its interior is greater than $x_{mo}$ of curve 301 in FIG. 5. In FIG. 6B, reference numeral 4 indicates a diffusion mask made of, for example, SiO$_2$ which is used for making the diffusion region 3 and its diffusion window is formed with a similar oxidized layer when the region 3 is formed by diffusion.

Figure 6C:
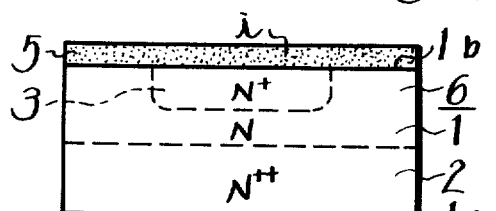

Then, as shown in FIG. 6C, the diffusion mask 4 on the surface 1b and the oxidized layer formed thereon are removed, and thereafter on the surface 1b there is formed, for example, by an epitaxial method, an intrinsic semiconductor layer or a semiconductor layer with the same or different conductivity type as that of the substrate 1. For example, an intrinsic silicon layer 5 is formed which is a base 6.

Figure 6D:
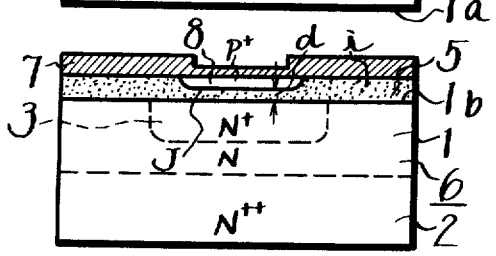

As shown in FIG. 6D, on the surface of the base 6, there is formed by a well known technique an insulating layer 7 such as SiO$_2$ which may be a diffusion mask. A diffusion window is selectively formed through the insulating layer 7 at the position opposite the region 3, an then an impurity with a different conductivity from that of the region 3 is diffused through the window into the layer 5 at a high impurity concentration to form therein a diffusion region 8, for example, of P-type conductivity and hence to form a rectifying junction J. In this case, the junction J is formed in the intrinsic or low impurity concentration semiconductor layer 5 and the depth of the region 8 and the thickness of the layer 5 are so selected that a distance $d$ between the junction J and the region 3 of the predetermined impurity concentration distribution is selected to be in the range between $0.1 \sim 0.5\mu$, for example $0.2\mu$.

Figure 6E:
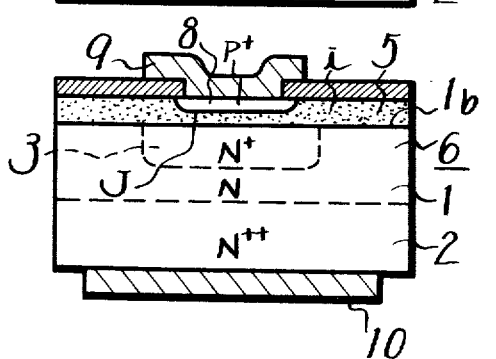

As shown in FIG. 6E, electrodes 9 and 10 are formed in ohmic contact with the regions 8 and 2, respectively. Thus, a semiconductor varicap is formed. With such a varicap, the region 3 is diffused into the substrate 1 from the surface 1b and has its maximum impurity concentration at the surface 1b, while the junction J is formed in the intrinsic or sufficiently low impurity concentration semiconductor layer 5 and the junction J is separated from the high impurity concentration region 3 or the surface 1b by $0.1 \sim 0.5\mu$, for example, $0.2\mu$. Therefore, its depletion layer goes to the surface 1b which shows a peak impurity concentration when V = O. Accordingly, if a voltage is applied from the surface 1b to the junction J to increase the reverse voltage and if the impurity concentration distribution of the region 3 is the distribution shown by the curve 301 in FIG. 5, the varicap has a characteristic which has the maximum concentration at $x = x_{mo}$ to obtain the ideal profile.

FIG. 7 is a graph illustrating the measured results of voltages applied to the varicap versus its variation of capacitive ratio $\Delta c/C$. In the graph of FIG. 7, a line 400 represents an ideal characteristic, a curve 401 the characteristic of the varicap of the invention, and a curve 402 that of a prior art varicap. As is apparent from FIG. 7, the varicap of the invention has a characteristic close to the ideal characteristic.

In the varicap shown in FIGS. 6A to 6E, the rectifying junction J is formed by the PN junction. However, it is possible that the diffusion region 8 can be omitted and a metal layer coated on the semiconductor layer 5 opposite the region 3 to form a Schottky barrier to thereby form a Schottky barrier type variable capacitance diode.

Further, in the embodiment shown in FIGS. 6A to 6E, the intrinsic or sufficiently low impurity concentration semiconductor layer 5 is formed by the epitaxial growth method, but the layer 5 can be formed by an ion injection method. An example using the ion injection method will be described with reference to FIGS. 8A to 8E.

Figure 8A:
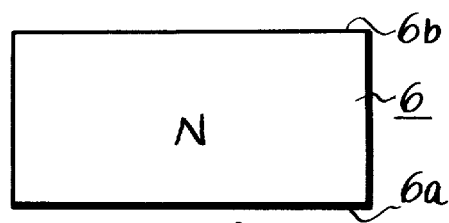
FIGS. 8A to 8E and FIGS. 9A to 9B, inclusive, are diagrams showing the steps for making other types of varicaps which could be used in the invention.

As shown in FIG. 8A, a semiconductor body, for example, a silicon body 6 with one conductivity type, for example, an N-type with an impurity concentration of about $\sim 10^{19}$ atoms/cm$^3$ is prepared.

Figure 8B:
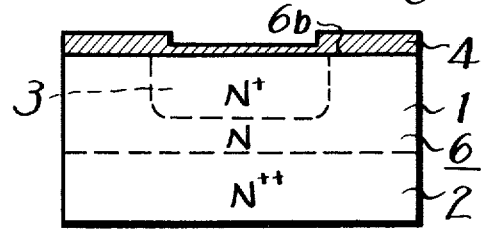

As shown in FIG. 8B, an impurity with the same conductivity type as that of the body 6 is diffused, for example, into the body 6 from its one surface 6a at a high impurity concentration to form a high impurity concentration semiconductor layer 2. An impurity of the conductivity type as the body 6 is selectively, for example, diffused into the body 6 from its other surface 6b to form a diffusion region 3 and hence to form a substrate region 1 between the region 3 and the semiconductor layer 2. In FIG. 8B, reference numeral 4 indicates a diffusion mask whose diffusion window is covered with an oxide layer which is formed during the diffusion of the region 3.

Figure 8C:
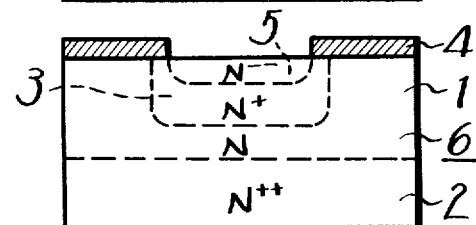

Then, as shown in FIG. 8C, a window is bored through the diffusion mask 4 opposite the region 3, and impurity ions with a different conductivity type from that of region 3 or P-type conductivity is injected into the region 3 by the injection method to cancel the N-type impurity at the surface of the region 3 and hence to form a semiconductor layer 5 of substantially intrinsic or low impurity concentration.

Figure 8D:
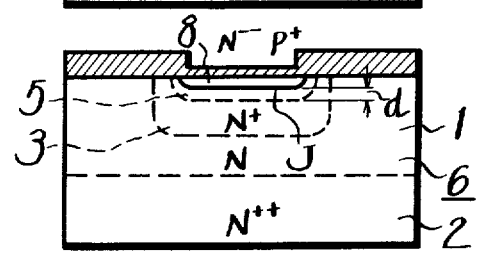
Figure 8E:
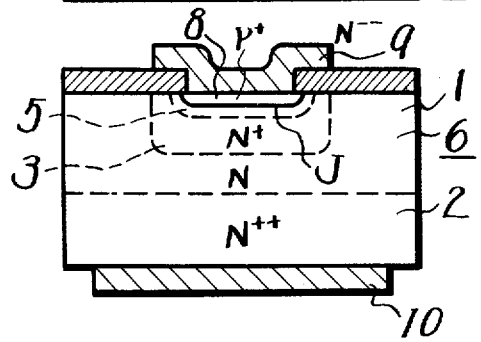

As shown in FIGS. 8D and 8E, the PN junction J is formed in a manner similar to that described with respect to FIGS. 6D and 6E or the Schottky barrier is formed to form the semiconductor varicap. In FIGS. 8D and 8E, the reference numerals the same as those used in FIGS. 6D and 6E represent similar elements, and their description will be omitted. Further, in the embodiment shown in FIGS. 8A to 8E, the distance d between the junction J and the region 3 is selected between 0.1$\mu$ and 0.5$\mu$ and desirably 0.2$\mu$.

In the semiconductor varicap of the invention made as mentioned above, the junction J is also formed in the intrinsic or low impurity concentration semiconductor layer 5, the distance d between the junction J and the region 3 is, for example, 2$\mu$, and the depletion layer is expanded to the position where the region 3 contacts the semiconductor layer 5, so that the position $x_{mo}$ of the expanded depletion layer at V = O exists at the highest impurity concentration.

In the embodiment shown in FIGS. 6A to 6E, the epitaxial or intrinsic or sufficiently low impurity concentration semiconductor layer 5 is formed on the surface of the substrate, but it is possible that a polycrystalline semiconductor, for example, polycrystalline silicon layer can be formed on the surface of the substrate as the semiconductor layer 5. An example of such construction will be described with reference to FIGS. 9A to 9E.

Figure 9A:
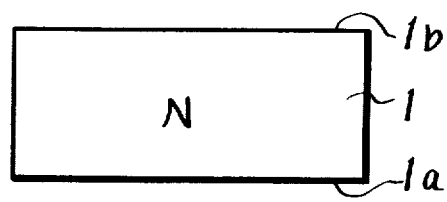
Figure 9B:
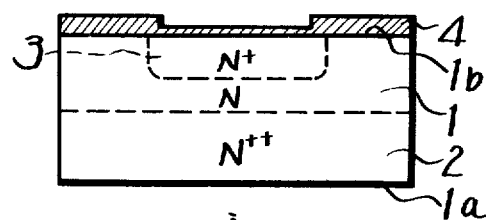
Figure 9C:
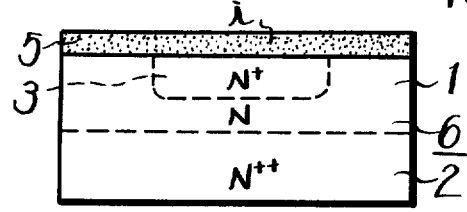
Figure 9D:
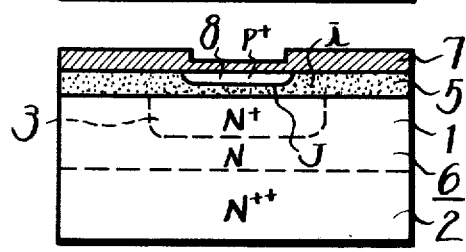
Figure 9E:
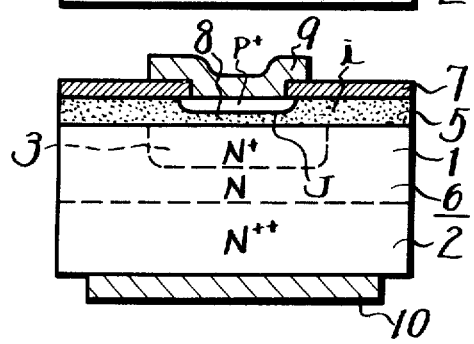

As shown in FIGS. 9A and 9B, processes which are the same as those described with reference to FIGs. 6A and 6B are carried out. Thereafter, as shown in FIG. 9C, a semiconductor layer 5 made of a polycrystalline silicon without being doped and with almost no impurity and having a high resistance is grown on the substrate 1 by a well known technique. Then, as shown in FIGS. 9D and 9E, the same processes as those described with reference to FIGS. 6D and 6E are carried out. In FIGS. 9A to 9E, reference numerals the same as those used in FIGS. 6A to 6D designate the same elements.

In the embodiment of FIGS. 9A through 9D, since the state of the electric field in the polycrystalline silicon is substantially the same as that in the single crystalline silicon, this semiconductor varicap has the same characteristics as those of the semiconductor varicap described with reference to FIGS. 6A to 6E.

The varicaps described above are used as the capacitance in the series resonant circuit shown in FIG. 1. However, in a practical circuit, the varicap is connected in various manners. In this case, the capacitance system is a non-linear capacitance and $\beta/\alpha$, $\gamma/\alpha$ or P are obtained from the factors of the Taylor's series for the capacitance.

A typical example of the capacitance system will now be considered. The capacitance system, in which a varicap C is connected in series to a capacitance $C_S$ as shown in FIG. 10, will be first considered. If it is assumed that an AC voltage $V_1$ is applied across the combined capacitance system, an AC voltage v will be applied across the varicap C which can be expressed as follows:

$$v = \frac{C_s}{C_o + C_s} V_1 \tag{400}$$

The characteristic of the varicap can be expressed as follows if the voltage across the varicap is v.

$$C = C_o \left( 1 + \frac{\beta}{\alpha} v + \frac{\gamma}{\alpha} v^2 \right) \tag{401}$$

Accordingly, the capacitance $C_t$ of the capacitance system shown in FIG. 10 is expressed as follows:

$$C_t = \frac{CC_s}{C + C_s} \tag{402}$$

$$C_t(V) = C_{to} \left( 1 + \frac{\beta'}{\alpha'} V_1 + \frac{\gamma'}{\alpha'} V_1^2 \right) \tag{403}$$

Now, the expansion factors $\beta'/\alpha'$ and $\gamma'/\alpha'$ will be obtained.

$$C_t(V) = \frac{C_o C_s}{C_o + C_s} \left\{ 1 + \left( \frac{C_s}{C_o + C_s} \right)^2 \frac{\beta}{C_o} V_1 + \left( \frac{C_s}{C_o + C_s} \right)^3 \frac{\gamma}{C_o} V_1^2 \right\} \tag{404}$$

$$\frac{\beta'}{\alpha'} = \left( \frac{C_s}{C_o + C_s} \right)^2 \frac{\beta}{C_o} \tag{405}$$

$$\frac{\gamma'}{\alpha'} = \left(\frac{C_s}{C_o + C_s}\right)^3 \frac{\gamma}{C_o} \quad (406)$$

$$P' = \frac{\gamma}{\alpha}\left(\frac{C_s}{C_o + C_s}\right)^3 - \frac{2\beta^2}{3\alpha^2}\left(\frac{C_s}{C_o + C_s}\right)^4 \quad (407)$$

The differential equation which will make P*′ zero is as follows:

$$\frac{C'}{C_o} \cdot \frac{\gamma}{\alpha} = \frac{2\beta^2}{3\alpha^2} \quad (408)$$

$$C' \frac{dC^2}{d^2V} = \frac{4}{3}\left(\frac{dC}{dV}\right)^2 \quad (409)$$

where $C' = C_o \dfrac{C_o + C_s}{C_s}$

The functional relationship between C and V which are solutions of the above differential equation are obtained, and then it is sufficient to construct a varicap which as the C - V characteristic which solves this relationship.

Next, a capacitance system, in which the varicap C is connected in parallel with a capacitance $C_p$ as shown in FIG. 11, will be considered. In this case, the capacitance $C_t$ of the whole capacitance system is expressed as follows:

$$C_t = C_p + C \quad (410)$$

$$C_t = C_p + C \quad (410)$$

$$C_t(V) = C_{to}\left(1 + \frac{\beta'}{\alpha'}V_1 + \frac{\gamma'}{\alpha'}V_1^2\right) \quad (411)$$

Then, in a manner as described above, the following equations can be derived.

$$C_t(V) = C_{to}\left(1 + \frac{\beta}{\alpha}V_1 + \frac{\gamma}{\alpha}V_1^2\right)$$
$$= (c_p + C_o)\left(1 + \frac{\beta}{C_o + C_p}V_1 + \frac{\gamma}{C_o + C_p}V_1^2\right) \quad (412)$$

$$\frac{\beta'}{\alpha'} = \frac{\beta}{C_o + C_p} \quad (413)$$

$$\frac{\gamma'}{\alpha'} = \frac{\gamma}{C_o + C_p} \quad (414)$$

$$P = \frac{\gamma}{\alpha} \frac{C_o}{C_o + C_p} \frac{2\beta^2}{3\alpha^2} \frac{C_o^2}{(C_o + C_p)^2} \quad (415)$$

The differential equation which will make P* zero is as follows:

$$\frac{C'}{C_o} \cdot \frac{\gamma}{\alpha} = \frac{2\beta^2}{3\alpha^2} \quad (416)$$

$$C' \frac{dC^2}{d^2V} = \frac{4}{3}\left(\frac{dC}{dV}\right)^2 \quad (417)$$

where $C' = C_o + C_p$.

Then, the functional relationship between C and V which are solutions of the differential equation are obtained and then a varicap is constructed which has the desired C - V characteristic.

A capacitance system, in which the capacitance $C_s$ is connected in series to the varicap C and the capacitance $C_p$ is connected in parallel to the series connection of $C_s$ and C as shown in FIG. 12, will now be considered. In this case, the capacitance $C_t$ of the whole capacitance system is expressed as follows:

$$C_t = C_p + \frac{CC_s}{C_s + C} \quad (440)$$

The capacitance system of FIG. 12 can be considered as a combination of the ones shown in FIGS. 10 and 11, and the following expressions are obtained:

$$C_t = \left(C_p + \frac{C_oC_s}{C_s + C_o}\right)\left(1 + \frac{\beta C_s^3}{(C_o + C_s)^2(C_sC_p + C_sC_o + C_oC_s)}V_1\right.$$
$$\left. + \frac{\gamma C_s^4}{(C_o + C_s)^3(C_sC_p + C_sC_p + C_oC_s)}V_1^2\right) \quad (441)$$

$$P* = \frac{\gamma}{\alpha} \cdot \frac{C_oC_s^4}{(C_o + C_s)^3(C_sC_p + C_sC_p + C_oC_s)}$$
$$- \frac{2\beta^2}{3\alpha^2} \frac{C_o^2C_s^4}{(C_o + C_s)^4(C_sC_p + C_sC_p + C_oC_s)^2} \quad (442)$$

The differential equation which will make P* zero is as follows:

$$\frac{C'}{C_o} \cdot \frac{\gamma}{\alpha} = \frac{2\beta^2}{3\alpha^2} \quad (443)$$

$$C' \frac{dC^2}{d^2V} = \frac{4}{3}\left(\frac{dC}{dV}\right)^2 \quad (444)$$

where

-continued
$$C' = \frac{(C_o + C_s)(C_oC_p + C_sC_p + C_oC_s)}{C_s^2}$$

Then, the functional relationship between C and V which are solutions of the above differential equation are obtained, and a varicap is constructed which has the desired C - V characteristic.

A circuit including the varicap C, capacitances $C_s$ and $C_p$ connected as shown in FIG. 13 will now be considered.

If the characteristics of the varicap C is expressed as follows:

$$C = C_o \left( 1 + \frac{\beta}{\alpha} v + \frac{\gamma}{\alpha} v^2 \right) \quad (418)$$

The capacitance $C_t$ of the whole circuit shown in FIG. 13 is expressed as follows:

$$C_T(V) = \frac{C_s(C_o + C_p)}{C_s + C_o + C_p} \left( 1 + \frac{\beta}{C_o} \cdot \frac{C_s^2 v}{(C_o + C_s + C_p)^2(C_o + C_p)} \right.$$

$$\left. + \frac{\gamma}{C_o} \cdot \frac{C_s^3 v^2}{(C_o + C_p + C_s)^3(C_o + C_p)} \right) \quad (419)$$

$$\frac{\beta'}{\alpha'} = \frac{\beta}{C_o} \cdot \frac{C_s^2}{(C_o + C_s + C_p)^2(C_o + C_p)} \quad (420)$$

$$\frac{\gamma'}{\alpha'} = \frac{\gamma}{C_o} \cdot \frac{C_s^3}{(C_o + C_p + C_s)^3(C_o + C_p)} \quad (421)$$

$$P = \frac{\gamma}{\alpha} \cdot \frac{C_s^3}{(C_o + C_p + C_s)^3(C_o + C_p)}$$

$$- \frac{2\beta^2}{3\alpha^2} \cdot \frac{C_s^4}{(C_o + C_s + C_p)^4(C_o + C_p)} \quad (422)$$

The differential circuit which will make P* zero is expressed as follows:

$$\frac{C'}{C_o} \cdot \frac{\gamma}{\alpha} = \frac{2\beta^2}{3\alpha^2} \quad (423)$$

$$C' \frac{dC^2}{d^2V} = \frac{4}{3} \left( \frac{dC}{dV} \right)^2 \quad (424)$$

where $C' = \frac{(C_o + C_s + C_p)(C_o + C_p)}{C_s}$.

Then, the functional relationship between C and V which are solutions of the above differential equation are obtained, and a varicap is constructed which as the desired C - V characteristic.

As may be apparent from the foregoing, with the resonance circuit of the present invention, a varicap is used which has the C-V characteristic which satisfies the differential equation $$C' \frac{d^2C}{dV^2} = \frac{4}{3} \left( \frac{dC}{dV} \right)^2,$$

where C' is a constant determined by the manner of connection of the capacitance system and C. $C' = C$ when the capacitance system consists of one varicap. The solution of the differential equation makes the fundamental distortion P* or $$P^* = \frac{\gamma}{\alpha} - \frac{2\beta^2}{\alpha} \cdot \frac{1}{3\alpha^2} \text{ zero.}$$

zero.

The resonant circuit of the invention can avoid defects such as tracking error, cross demodulation and so on which may be caused by non-linearity, so that the resonant circuit of the invention contributes much to the practical use of electronic tuning circuits and makes them practical.

The above examples use one varicap in their capacitance systems of the series resonance circuits. However, a series resonance circuit of a capacitance system, in which two varicaps $C_1$ and $C_2$ are connected back to back and useable in an FM tuner is shown in FIG. 14. In this example, a bias voltage of $V_o - v/2$ is applied across the first varicap $C_1$ and a bias voltage of $V_o + v/2$ is applied across the second varicap $C_2$. Accordingly, the total capacitance $C_t$ of the capacitance system can be calculated as follows:

$$C_1 = \alpha_1 \left\{ 1 - \frac{\beta_1}{\alpha_1} \cdot \frac{v}{2} + \frac{\gamma_1}{\alpha_1} \left( \frac{v}{2} \right)^2 \right\} \quad (425)$$

$$C_2 = \alpha_2 \left\{ 1 \frac{\beta_2}{\alpha_2} \cdot \frac{v}{2} + \frac{\gamma_2}{\alpha_2} \left( \frac{v}{2} \right)^2 \right\} \quad (426)$$

$$C_t = \frac{C_1 C_2}{C_1 + C_2} \quad (427)$$

If it is assumed that $2C_o = \alpha_1 = \alpha_2 = \alpha$, $\beta_1 = \beta_2 = \beta$, and $\gamma_1 = \gamma_2 = \gamma$ which means the same value varicaps are connected in series, the capacitance $C_t$ is expressed as follows:

$$C_t = \frac{4C_o^2 \left( 1 + \frac{\beta_1}{\alpha_1} \cdot \frac{v}{2} + \frac{\gamma_1}{\alpha_1} \cdot \frac{v^2}{4} \right)\left( 1 + \frac{\beta_2}{\alpha_2} \cdot \frac{v}{2} + \frac{\beta_2}{\alpha_2} \cdot \frac{v^2}{4} \right)}{4 C_o \left( 1 + \frac{\gamma_1}{4\alpha_1} v^2 \right)} \quad (428)$$

If in the above expression the capacitance shift is small, the capacitance $C_t$ is expressed as follows.

$$C_t = C_o \left[ 1 + \left\{ \frac{\gamma}{4\alpha} - \frac{1}{4} \left( \frac{\beta}{\alpha} \right)^2 \right\} v^2 \right] \quad (429)$$

Accordingly, the distortion $P_d$ is expressed as follows:

$$P^*_d = \frac{1}{4}\left(\frac{\gamma}{\alpha} - \left(\frac{\beta}{\alpha}\right)^2\right) \quad (430)$$

The differential equation which will make $P^*_d$ zero can be obtained and is:

$$C\frac{d^2C}{dV^2} = 2\left(\frac{dC}{dV}\right)^2 \quad (431)$$

Accordingly, if the varicap is made to have a C - V characteristic which satisfies the differential equation (431), the distortion of the varicap will be reduced to a minimum.

The above equation (43) can be changed as follows:

$$P^*_d = \frac{1}{4}\left(\frac{\gamma}{\alpha} - \frac{2}{3}\left(\frac{\beta}{\alpha}\right)^2\right) - \frac{1}{12}\left(\frac{\beta}{\alpha}\right)^2 \quad (432)$$

Therefore, by reducing $$\left(\frac{\gamma}{\alpha} - \frac{2}{3}\left(\frac{\beta}{\alpha}\right)^2\right)$$

to zero, the distortion $P_d$ can be substantially reduced. In other words, if the varicap is made to have a C - V characteristic approximately satisfying $$C'\frac{d^2C}{dV^2} = \frac{4}{3}\left(\frac{dC}{dV}\right)^2$$

it reduces the distortion.

When two varicaps are connected in a forward manner in the capacitance system, the distortion $P_d^{*\prime}$ can be expressed as follows:

$$P_d^{*\prime} = \frac{\gamma}{4} + \frac{1}{12}\left(\frac{\beta}{\alpha}\right)^2$$

$$= \frac{1}{4}\frac{\gamma}{\alpha} - \frac{2}{3}\left(\frac{\beta}{\alpha}\right)^2 + \frac{1}{4}\left(\frac{\beta}{\alpha}\right)^2$$

A parallel resonance circuit is shown in FIG. 15. In FIG. 15, reference numerals 500 indicate by-pass capacitors. In this example, since an AC bias v is applied to the varicaps $C_1$ and $C_2$ in reverse phase, the following expressions can be derived.

$C_1 = C \beta v + \gamma v^2$
$C_2 = C - \beta v + \gamma v^2$
$C_t = 2C + 2\gamma v^2$
$= 2C(1 + \gamma v^2)$ Accordingly, in order to cancel the non-linear distortion, the following equation must be satisfied.

$\gamma = 0$
$d^2C/dv^2 = 0$
$C = aV + b$

It may be apparent that many modifications and variations could be effected by one skilled in the art without departing from the spirits or scope of the novel concepts of the present invention.

I claim as my invention:

1. A resonance circuit comprising:
   a. an inductive means;
   b. a capacitive means having a semiconductor junction element which includes a layer of intrinsic semiconductor material adjacent the junction and which satisfies the equation $$C\frac{d^2C}{dV^2} = \frac{4}{3}\left(\frac{dC}{dV}\right)^2$$

where C is the capacitance of said element when a voltage V is applied thereto and a junction of said junction element is reverse biased and $C'$ is a constant,
   c. means for applying a signal to said element, said $C'$ is equal to said C, and $C = C_D(V+V_D)^{-3}$ is satisfied where $C_D$ and $V_D$ are constants, and said element has an impurity concentration proportional to $5/x 3$, where $x$ is the distance from said junction, and a low doping profile exists in the neighborhood of said junction.

2. A resonance circuit according to claim 1, in which said capacitive means has at least one capacitor connected in series and/or parallel to said element, and $C'$ comprises the effective capacitance of said element and said capacitor.

3. A resonant circuit according to claim 1 wherein said capacitive means has at least one additional capacitor connected in series to said semiconductor junction element and $C'$ comprises the effective capacitance of said semiconductor junction element and said additional capacitor.

4. A resonant circuit according to claim 1 wherein said capacitive means has at least one additional capacitor connected in parallel to said semiconductor junction element and $C'$ comprises the effective capacitance of said semiconductor junction element and said additional capacitor.

5. A resonance circuit comprising:
   a. an inductive means;
   b. a capacitive means having two semiconduction junction elements and includes layers of intrinsic semiconduction material adjacent the junctions and connected in series and in opposite directions,
   c. A voltage source connected to said capacitive means, said element satisfying the equation $$C'\frac{d^2C}{dV^2} = 2\left(\frac{dC}{dV}\right)^2$$

where C is the capacitance of said element when a voltage V is applied from said voltage source and a junction of said element is reversely biased and $C'$ is a constant; and means for applying a signal to said elements.

6. A resonant circuit comprising,
   a. an inductor,
   b. a capacitive means connected to said inductor,
   c. a voltage source connectable to said capacitive means,
   d. said capacitive means comprising a semiconductor junction element and includes a layer of intrinsic semiconductor material adjacent the junction and which satisfies the equation $$C' \frac{d^2C}{dV^2} = \frac{4}{3} \left(\frac{dC}{dV}\right)^2$$

where C is the capacitance of said element when a voltage V is applied thereto from said voltage source and a junction of said semiconductor element is reverse biased and C' is a constant.

7. A resonant circuit according to claim 6 in which C' is equal to C and $C = C_D (V + V_D)^{-3}$ is satisfied where $C_D$ and $V_D$ are constants.

8. A resonant circuit according to claim 7 in which said semiconductor junction element has an impurity concentration proportional to $X^{-5/3}$ where X is the distance from said junction and a low doping profile exists near said junction.

* * * * *